(12) United States Patent
Bowman

(10) Patent No.: US 6,621,146 B1
(45) Date of Patent: Sep. 16, 2003

(54) METHOD AND APPARATUS FOR THE USE OF EMBEDDED RESISTANCE TO LINEARIZE AND IMPROVE THE MATCHING PROPERTIES OF TRANSISTORS

(75) Inventor: Robert J. Bowman, Fairport, NY (US)

(73) Assignee: LSI Logic Corporation, Milpitas, CA (US)

(*) Notice: Subject to any disclaimer, the term of this patent is extended or adjusted under 35 U.S.C. 154(b) by 82 days.

(21) Appl. No.: 09/964,157

(22) Filed: Sep. 26, 2001

(51) Int. Cl.[7] .................. H01L 29/167; H01L 29/207; H01L 29/227; H01L 31/0288
(52) U.S. Cl. .................. 257/607; 257/327; 257/328; 257/335; 257/358; 257/359; 257/360; 257/336; 257/344; 257/408; 257/608
(58) Field of Search .................. 257/327, 328, 257/335, 358, 359, 360, 336, 344, 408, 607, 608

(56) References Cited

U.S. PATENT DOCUMENTS

| | | | |
|---|---|---|---|
| 4,199,733 A | * | 4/1980 | Schade, Jr. .................. 330/277 |
| 4,978,628 A | * | 12/1990 | Rosenthal .................. 438/220 |
| 5,631,485 A | * | 5/1997 | Wei et al. .................. 257/344 |
| 5,972,763 A | * | 10/1999 | Chou et al. .................. 438/305 |
| 5,973,362 A | * | 10/1999 | Park et al. .................. 257/344 |
| 5,973,367 A | * | 10/1999 | Williams .................. 257/365 |
| 6,034,388 A | * | 3/2000 | Brown et al. .................. 257/296 |
| 6,078,080 A | | 6/2000 | Kadosh et al. .................. 257/344 |
| 2002/0163046 A1 | * | 11/2002 | Imam et al. .................. 257/365 |

* cited by examiner

Primary Examiner—Amir Zarabian
Assistant Examiner—Ida M. Soward
(74) Attorney, Agent, or Firm—Westman, Champlin & Kelly

(57) ABSTRACT

An integrated circuit includes a substrate and a degenerated transistor. The degenerated transistor includes a control terminal formed on the substrate, a channel formed in the substrate beneath the first control terminal, first and second heavily-doped regions embedded in the substrate on opposing sides of the channel, first and second output contacts positioned on the first and second heavily-doped regions, respectively, and a lightly-doped region extending between the first heavily-doped region and the channel. The lightly-doped region has a length that is selected such that the first output contact is spaced from a respective edge of the control terminal by a distance that is at least twice as great as a minimum distance defined for the technology in which the integrated circuit is fabricated and the lightly-doped region has a desired resistance in series with the first output contact.

16 Claims, 4 Drawing Sheets

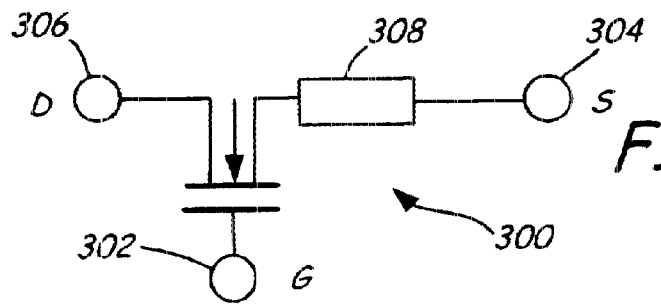
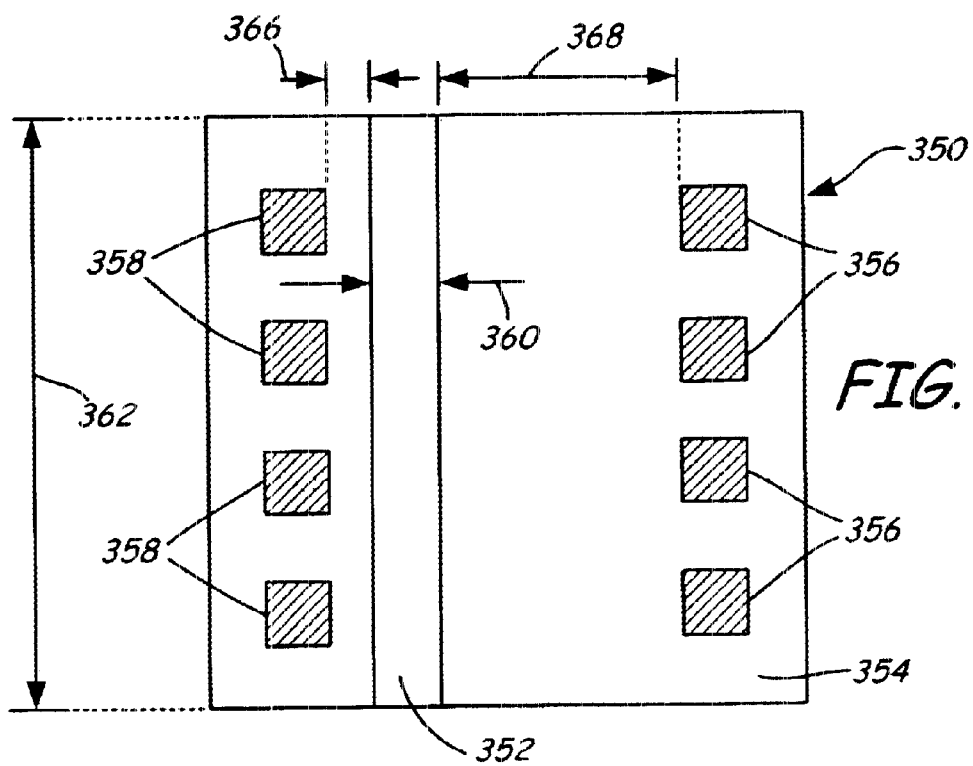
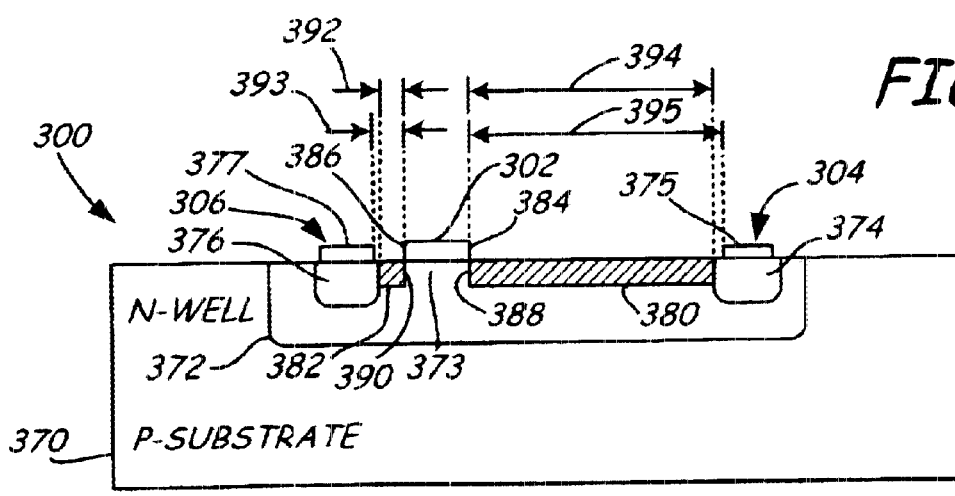

METHOD AND APPARATUS FOR THE USE OF EMBEDDED RESISTANCE TO LINEARIZE AND IMPROVE THE MATCHING PROPERTIES OF TRANSISTORS

FIELD OF THE INVENTION

The present invention relates to semiconductor integrated circuits and, more particularly, to linearization of the transconductance of active devices in integrated circuits.

BACKGROUND OF THE INVENTION

In semiconductor integrated circuits it is occasionally desirable to place a resistance in series with the source or drain of field effect devices, such as metal oxide semiconductor field effect transistors (MOSFETs). A series source resistance accomplishes device degeneration with improved transconductance linearity or superior matching to other similarly degenerated devices. A series drain resistance provides precision gain and stabilizes output conductance in current steering circuits. Series resistances in both terminals offer a symmetrical device that can isolate capacitances in switching applications and provide a precision gain block.

For example, series source resistances are often used in precision current mirrors, where the drain current in a reference transistor is mirrored into the drain of one or more output transistors at a desired current gain. The desired current gain can be accomplished by scaling the sizes of the output transistors relative to the size of the reference transistor or by scaling the relative sizes of resistors placed in series with the transistors. For example, a gain of two can be accomplished by making the output transistors twice the size of the reference transistor. Alternatively, a gain of two can be accomplished by placing a resistance of "R" in series with the reference transistor and a resistance of "R/2" in series with the output transistors.

Scaling the sizes of the transistors themselves can be difficult to control precisely and is usually accomplished by increasing the device area. With series resistances the level of current through each transistor becomes more a function of the series resistance than a function of the transistor size, therefore allowing more accurate control of the current gain in a current mirror. Also, the output impedance is increased which makes the current mirror less sensitive to external effects.

The standard approach for introducing a series resistance in a semiconductor device is to use a separate mask-defined diffused, thin-film or implanted resistor, which is electrically coupled to special contacts at the local interconnect layer. These contacts are then electrically coupled in series with the source or drain contacts of the semiconductor device.

This type of series resistance has several disadvantages. For example, the resistance consumes considerable area on the integrated circuit and introduces variability in current gain due to variability in local contact resistance. Precision current mirroring is particularly difficult in scaled-down semiconductor technologies having low rail voltages. Also, short channel active devices can often have poorly matched device characteristics. Improved matching has always come at the expense of increased area.

Improved methods and structures for linearizing and matching semiconductor transistors are therefore desired.

SUMMARY OF THE INVENTION

One aspect of the present invention relates to an integrated circuit having a substrate and a degenerated transistor. The degenerated transistor includes a control terminal formed on the substrate, a channel formed in the substrate beneath the first control terminal, first and second heavily-doped regions embedded in the substrate on opposing sides of the channel, first and second output contacts positioned on the first and second heavily-doped regions, respectively, and a lightly-doped region extending between the first heavily-doped region and the channel. The lightly-doped region has a length that is selected such that the first output contact is spaced from a respective edge of the control terminal by a distance that is at least twice as great as a minimum distance defined for the technology in which the integrated circuit is fabricated and the lightly-doped region has a desired resistance in series with the first output contact.

Another aspect of the present invention relates to an integrated circuit having first and second voltage supply terminals for providing a supply voltage, a substrate, and a degenerated transistor coupled between the first and second voltage supply terminals. The degenerated transistor includes a gate, heavily-doped source and drain regions embedded in the substrat, source and drain contacts positioned on the source and drain regions, respectively, a channel defined beneath the gate and between the source and drain regions, and a lightly-doped region positioned between a respective one of the source and drain regions and the channel. The lightly-doped region has a length measured from the channel to the respective source or drain region and a width measured along a width of the gate that are selected such that the lightly-doped region produces a voltage drop from the respective source or drain contact to the channel of at least one percent of the supply voltage.

Another aspect of the present invention relates to a current mirror fabricated on an integrated circuit. The current mirror includes a current input, a current output, and first and second transistors. The first transistor includes a first gate, a first heavily-doped source region, a first source contact, a first heavily-doped drain region, a first drain contact electrically coupled to the first gate, a first channel, and a first lightly-doped source region which extends between the first channel and the first heavily-doped source region. The first lightly-doped source region extends for a first length that is selected such that the first source contact is spaced from a respective edge of the first gate by a first distance that is greater than a minimum distance defined for the technology in which the integrated circuit is fabricated and the first lightly-doped source region has a desired first resistance in series with the first source contact. The second transistor includes a second gate electrically coupled to the first gate, a second heavily-doped source region, a second source contact, a second heavily-doped drain region, a second drain contact that defines the current output, a second channel, and a second lightly-doped source region which extends between the second channel and the second heavily-doped source region. The second lightly-doped source region extends for a second length that is selected such that the second source contact is spaced from a respective edge of the second gate by a second distance that is greater than the minimum distance and the second lightly-doped source region has a desired second resistance in series with the second source contact.

Another aspect of the present invention relates to a method of fabricating transistors on a substrate for a given semiconductor technology. The method includes fabricating the transistors with a control terminal, first and second output terminals, a channel, first and second heavily-doped regions in contact with the first and second output terminals, respectively, on opposing sides of the channel, and a lightly-doped region extending between the first heavily-doped region and the channel. A first set of the transistors is fabricated such that the lightly-doped region of each transistor in the first set has a first length between the first heavily-doped region and the channel and such that the first output terminal has a standard spacing from a nearest edge of the control terminal of that transistor. At least one of the transistors not in the first set is degenerated such that the lightly-doped region of the degenerated transistor has a second length, which is greater than the first length, between the first heavily-doped region and the channel and such that the first output terminal of the degenerated transistor has a non-standard spacing, which is at least twice the standard spacing, from a nearest edge of the control terminal of the degenerated transistor.

BRIEF DESCRIPTION OF THE DRAWINGS

FIG. 3A shows a schematic symbol for a non-standard NMOS transistor having an embedded series source resistor according to one embodiment of the present invention.

FIG. 3B shows a fabrication mask layout for the transistor shown in FIG. 3A, which has an extended lightly-doped region according to one embodiment of the present invention.

FIG. 3C is a simplified cross-sectional view of the device structure of the transistor shown in FIG. 3A, as fabricated by the mask shown in FIG. 3B.

DETAILED DESCRIPTION OF ILLUSTRATIVE EMBODIMENTS

Figure 1:
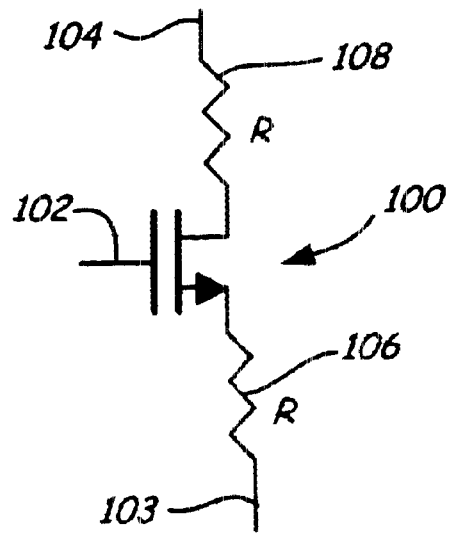
FIG. 1 is a diagram which schematically illustrates an N-channel metal oxide semiconductor (NMOS) field effect transistor having embedded series resistances within the source and drain regions, according to one embodiment of the present invention.

FIG. 1 is a diagram which schematically illustrates an n-channel metal oxide semiconductor (NMOS) field effect transistor 100 having embedded series resistances within the source and drain regions. Transistor 100 has a gate 102, a source 103 and a drain 104. Gate 102 serves as a control terminal for transistor 100, while source 103 and drain 104 serve as output terminals. Resistors 106 and 108 are fabricated in series with the source 103 and the drain 104, respectively. Resistances 106 and 108 each have a resistance "R" and are implemented by extending lightly-doped implant regions on both sides of the channel.

Lightly-doped implants have been used in the past for mitigating hot carrier effects in short channel field effect devices. The placement of these implants is defined by a special mask layer during fabrication. These implants introduce a small but finite parasitic resistance in series with the source and drain regions of the device. The lengths of these regions were therefore minimized in order to minimize the parasitic resistances. Also, it was common to add a thin conductive layer such as a layer of silicide on top of the lightly-doped regions to reduce further the surface resistances of the regions.

In one embodiment of the present invention, one or both of these lightly-doped regions are significantly extended in length to accomplish the benefits of introducing a scalable series resistance within the devices without the need for additional local contacts.

Figure 2A:
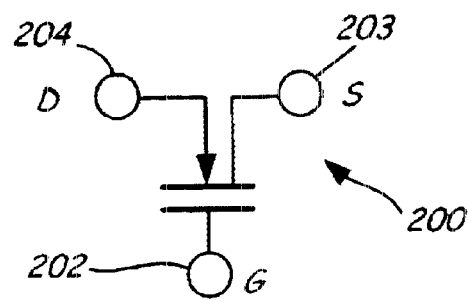
FIG. 2A shows a schematic symbol for a typical standard NMOS transistor according to the prior art.
Figure 2B:
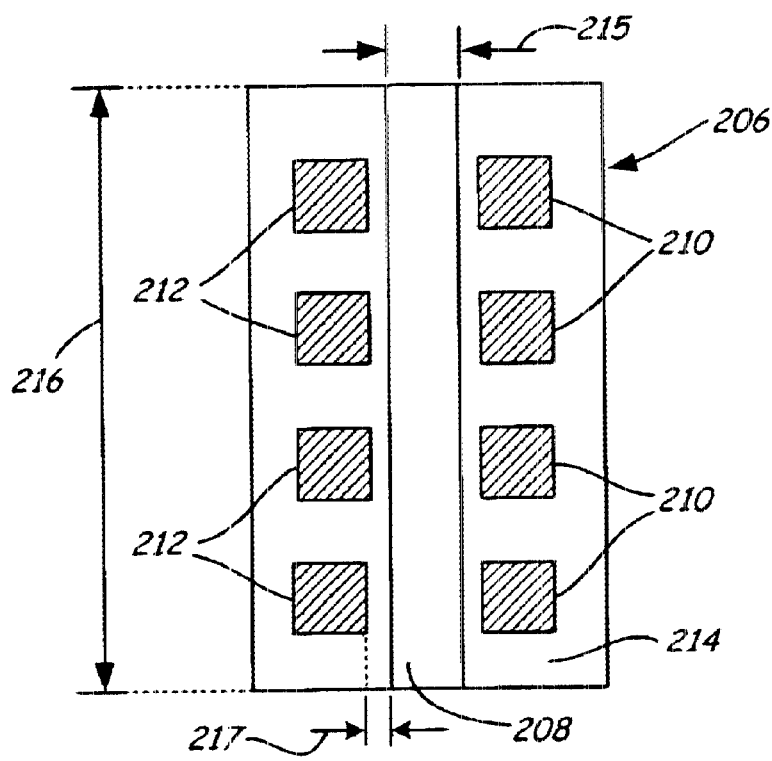
FIG. 2B shows a fabrication mask layout for the transistor shown in FIG. 2A, which has non-extended lightly-doped regions according to the prior art.
Figure 2C:
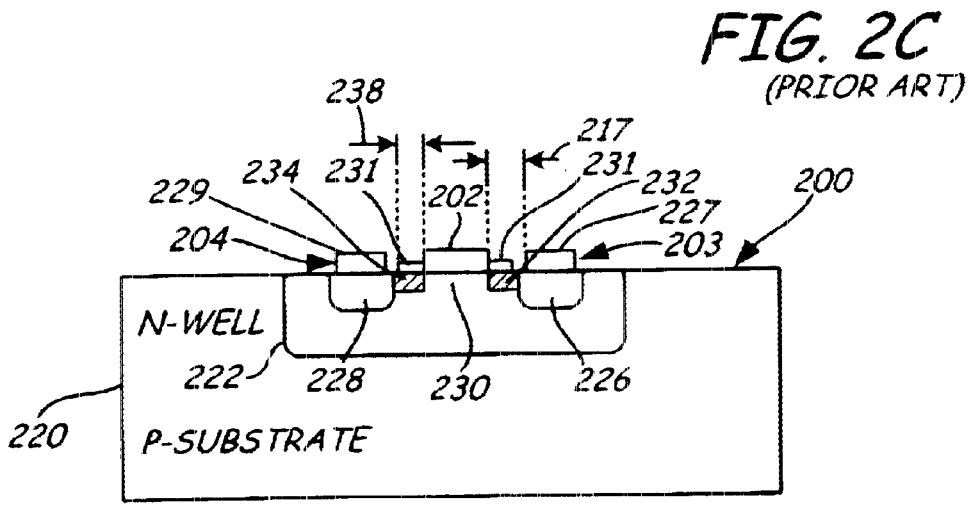
FIG. 2C is a simplified cross-sectional view of the device structure of the transistor shown in FIG. 2A, as fabricated by the mask shown in FIG. 2B.

FIGS. 2A–2C show a typical standard NMOS transistor 200 and mask layout 206 having short lightly-doped regions according to the prior art. FIG. 2A shows the schematic symbol for NMOS transistor 200, which has a gate 202, a source 203 and a drain 204.

FIG. 2B shows a fabrication mask layout 206 for transistor 200, with several of the mask layers superimposed on one another. Layout 206 has a polysilicon gate region 208 for defining gate 202 shown in FIG. 1, a plurality of local interconnect source contact regions 210 and drain contact regions 212, and a lightly-doped mask region 214. Each of the contact regions 210 and each of the contacts regions 212 are electrically coupled in parallel with one another through subsequent interconnect layers. The use of a plurality of parallel source and drain contact regions reduces the effective resistances of the contacts. Gate region 208 defines a channel length 215 and a channel width 216 of transistor 200.

Lightly-doped mask region 214 is used during fabrication to define regions on the semiconductor substrate that are be implanted with impurities at a low concentration level, as compared to the more heavily-doped source and drain regions. Lightly-doped mask region 214 has a length between source and drain contact regions 210 and 212 that positions the inside edges of source and drain contact regions 210 and 212 at a spacing 217 from the respective nearest lateral edges of polysilicon gate region 208. Spacing 217 is the minimum spacing that is specified for the particular semiconductor technology in which transistor 200 is fabricated.

FIG. 2C is a simplified cross-sectional view of the device structure of transistor 200, as fabricated by mask 206. Transistor 200 has a P-type substrate 220, an N-well 222, polysilicon gate 202, source 203 and drain 204. Source 203 is defined by a heavily-doped source region 226 and a source contact terminal 227. Drain 204 is defined by a heavily-doped drain region 228 and a drain contact terminal 229. Heavily-doped regions 226 and 228 are doped P+ through ion implantation of boron difluoride, for example, at a desired concentration. A channel 230 is positioned between source region 226 and drain region 228.

In short channel field effect devices, the length of channel 230 between source region 226 and drain region 228 becomes smaller. If the supply voltage remains constant, the electric field across the channel increases. This increase in electrical field can cause hot carrier effects in the transistor, which can result in unwanted shifts in the electrical parameters of the device. These effects can be mitigated by implanting lightly-doped regions 232 and 234 between channel 230 and one or both of source region 226 and drain region 228. Lightly-doped regions 232 and 234 are formed at the edges of gate 202, adjacent channel 230. Lightly-doped regions 232 and 234 are doped P− through ion implantation of boron difluoride, for example, at a concentration that is less than the concentration in heavily-doped regions 226 and 228. For example, lightly-doped regions 232 and 234 have a dopant concentration that is at least ten times less than that of heavily-doped regions 226 and 228.

The lightly-doped regions reduce hot carrier effects by reducing the maximum electric field across channel 230. Disadvantages of lightly-doped regions 230 and 232 include increased fabrication complexity and increased parasitic resistance due to their light doping levels. Therefore, these regions have been made as short as possible to minimize the distance from source contact 227 and drain contact 229 to channel 230, at the respective edges of gate 202. Also, it is common to add a thin conductive layer or film 231, such as a layer of silicide, over lightly-doped regions to reduce the surface resistance of the lightly-doped regions.

During the traditional design process of an integrated circuit having devices with lightly-doped drain regions, the dimension that is normally instantiated in design rule checkers is the standard minimum length 217 from the edges of contacts 227 and 229, at the surface of the substrate, to the edge of the polysilicon gate 202. Any spacing below the minimum dimension is flagged as a design rule error. Any spacing above the minimum dimension is discouraged by the design tools themselves, which always apply this minimum dimension when laying-out the transistor geometry. A dimension larger than this minimum would be considered unwise because it only serves to make a larger, slower transistor. In FIG. 2C, lightly-doped regions 232 and 234 each have a length 238, measured from the respective heavily-doped region 226 or 228 to a nearest edge of gate 202 such that contacts 227 and 229 have the standard minimum spacing 217 that is defined for the technology in which transistor 200 is fabricated.

FIGS. 3A–3C illustrate a non-standard NMOS transistor 300 and a mask 350 with an extended lightly-doped region according to one embodiment of the present invention. FIG. 3A shows the schematic symbol of non-standard transistor 300. Transistor 300 has a gate 302, a source 304 and a drain 306. A resistance 308 is embedded within transistor 300, in series with source 304. This resistance is implemented by extending the lightly-doped region between source 304 and the channel of transistor 300.

FIG. 3B is a top plan view of a mask layout 350 for transistor 300, according to one embodiment of the present invention. Layout 350 shows several of the mask patterns used to fabricate transistor 300, which are superimposed on one another. Layout 350 includes polysilicon gate region 352, lightly-doped mask region 354, source contact regions 356 and drain contact regions 358. These contact regions define the local interconnect regions of transistor 300. Gate region 352 defines a channel length 360 and a channel width 362. Once again, contact regions 356 are electrically coupled in parallel with one another and contact regions 358 are electrically coupled in parallel with one another during subsequent fabrication steps. Layout 350 can have any number of source and drain contact regions 356 and 358 in alternative embodiments.

Lightly-doped mask region 354 is used during fabrication to define regions on the semiconductor substrate that are be implanted with impurities at a low concentration level, as compared to the more heavily-doped source and drain regions. The spacing 366 from drain contact regions 358 to the nearest edge of gate region 352 is the standard minimum spacing for the technology in which transistor 300 is fabricated. However, the spacing 368 from source contact regions 356 to the nearest edge of gate region 352 has been extended significantly from the standard minimum spacing in order to implement embedded resistor 308 (shown in FIG. 3A) without requiring any additional local contacts. Spacing 368 is significantly greater than spacing 366. In one embodiment, spacing 368 is at least twice spacing 366.

FIG. 3C is a cross-sectional view of the NMOS device structure for transistor 300 according to one embodiment of the present invention. Transistor 300 has a P-type substrate 370, an N-well 372, polysilicon gate 302, source 304, drain 306, and a channel 373. Source 304 is defined by a heavily-doped source region 374 and a source contact terminal 375. Drain 306 is defined by a heavily-doped drain region 376 and a drain contact terminal 377. Heavily-doped regions 374 and 376 are doped P+ through ion implantation of boron difluoride, for example, at a desired concentration. Channel 373 is positioned between source region 374 and drain region 376.

In addition, lightly-doped regions 380 and 382 are implanted between channel 373 and heavily-doped regions 374 and 376, respectively. Lightly-doped regions 380 and 382 are doped P– through ion implantation of boron difluoride, for example, at a concentration that is less than the concentration in heavily-doped regions 374 and 376. For example, lightly-doped regions 380 and 382 dopant concentrations that are at least ten times less than that of heavily-doped regions 374 and 376.

Polysilicon gate 306 has lateral edges 384 and 386, which generally define the lateral positions of the junctions 388 and 390 of channel 373 with lightly-doped regions 380 and 382, respectively. In accordance with the mask layout shown in FIG. 3B, lightly-doped region 382 has a length 392 which is measured from heavily-doped region 376 to channel junction 390. Length 392 defines a standard minimum spacing 393 between drain contact terminal 377 and the nearest edge 386 of gate 302. In contrast, lightly-doped region 380 has a significantly greater length 394, which is measured from heavily-doped source region 374 to channel junction 388. Length 394 defines a non-standard spacing 395 between source contact terminal 375 and the nearest edge 384 of gate 302.

Spacing 395 is significantly greater than spacing 393. For example in LSI Logic Corporation's G12 process, the minimum spacing between the drain contact and the nearest side wall of the polysilicon gate is 0.165 microns. In one embodiment of the present invention, certain transistors in an integrated circuit design are selected to be degenerated with one or both of that transistor's lightly-doped regions being extended significantly such that the contacts are positioned significantly beyond the minimum spacing of 0.165 microns. For example, the contacts can be positioned 10 microns or more from the gate edge.

The particular length 394 of the lightly-doped region 380 is selected so that lightly-doped region 380 introduces a desired sheet resistance in series with contact 375. In one embodiment, lightly-doped region 380 has a length 394 and a width (along the width 362 of gate 302, as shown in FIG. 3B) that are selected such that source 304 produces a voltage drop from the edge of source contact 375 to channel junction 388, at the edge 384 of gate 302, of at least one percent of the supply voltage across which transistor 300 is coupled. With this amount of voltage drop, the resistance introduced by region 380 is considered to be significantly greater than the parasitic resistance introduced by a standard-sized lightly-doped region for reducing hot carrier effects. In another embodiment, source 306 produces a voltage drop of at least five percent of the supply voltage.

A further advantage of using an extended lightly-doped region as an embedded series resistor is that its resistance scales down proportionately with increasing device width to maintain a constant current density over typical process variations. This is important in current mirror applications where such a small degeneration resistor can scale down linearly with device width to maintain a constant but small source degeneration voltage.

In FIGS. 3A–3C, the lightly-doped region is extended only within the source of the transistor. In alternative embodiments, the lightly-doped regions can be extended within either or both of the source and drain of the transistor. Any device structure which utilizes a lightly-doped region in series with the output terminals of a semiconductor device to reduce the electrical field influence on hot carrier generation can be modified to extend the lightly-doped regions in accordance with the present invention. For example, extended lightly-doped regions can be used in any field effect device, such as NMOS, PMOS, CMOS, GASFET, HEMFET and MESFET devices.

Embedded series resistors as shown in FIGS. 3A–3C can be used in a variety of applications, such as current mirrors in low voltage processes, current steering circuits and precision gain blocks. The extended lightly-doped regions accomplish the benefits of introducing a small but scalable series resistance within the active devices without the need for additional local contacts. A series source resistance accomplishes device degeneration with improved transconductance linearity or superior matching to other similarly degenerated devices. A series drain resistance provides precision gain and stabilizes output conductance in current steering circuits. Series resistances in both the source and drain offers a symmetrical device that can isolate capacitances in switching applications and can provide a precision gain block.

Figure 5:
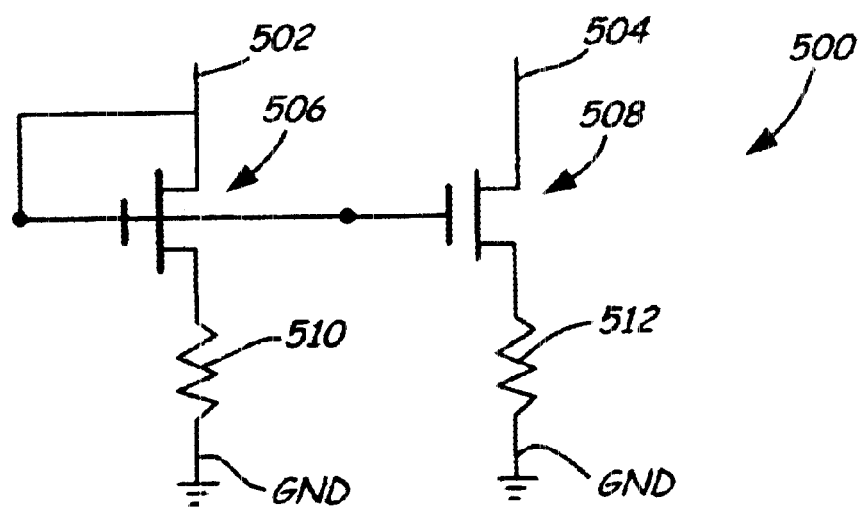
FIG. 5 is a schematic diagram illustrating a high accuracy current mirror implemented with the use of embedded series source resistors according to one embodiment of the present invention.
Figure 4:
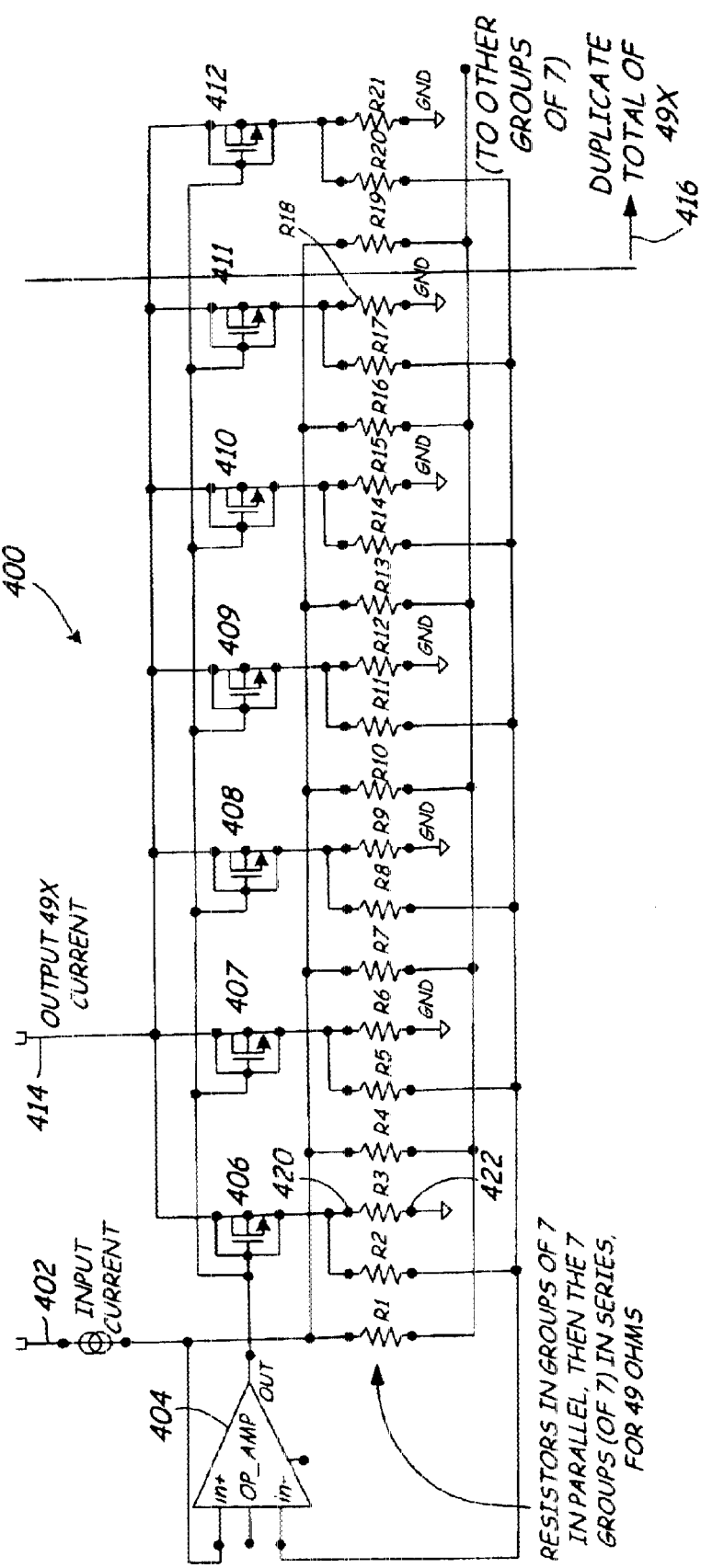
FIG. 4 is a schematic diagram of a high accuracy current mirror implemented with the use of matched resistors according to the prior art.

FIGS. 4 and 5 illustrate the advantages over the prior art that can be achieved when using extended lightly-doped regions for introducing small, scalable resistors in series with active devices in a current mirror on an integrated circuit.

FIG. 4 is a schematic diagram of a high accuracy current mirror 400 implemented with the use of matched resistors according to the prior art. Current mirror 400 includes current input 402, operational amplifier 404, N-channel output transistors 406–412, resistors R1–R21 and current output 414. In the example shown in FIG. 4, the input current received at current input 402 is mirrored into current output 414 with a current gain of 49. Output transistors 406–412 are essentially coupled in parallel with one another, with the gate of each transistor being coupled to the output of amplifier 404 and the drain of each transistor being coupled to current output 414. The sources of each transistor 406–412 is coupled to voltage supply terminal GND through a respective resistor R3, R6, R9, R12, R15, R18 and R21 and to the inverting input of amplifier 404 through a respective resistor R2, R5, R8, R11, R14, R17 and R20. Transistors 406–414 are matched with one another, with each transistor having substantially the same channel length and width. The circuit formed by output transistors 406–412 and resistors R1–R21 is duplicated a total of 49 times, as indicated by arrow 416.

Resistors R1–R19 have the same resistance, such as 49 ohms. Accuracy is improved by using separate groups of three matched resistors. In the example shown, these groups include resistors R2–R4, R5–R7, R8–R10, R11–R13, R14–R16 and R17–R19, etc. Input reference resistors R1, R4, R7, R10, R13, R16 and R19 are coupled in parallel with one another in groups of seven. Then, the seven groups of seven resistors are coupled in series with one another for an effective precision resistance of 49 ohms.

The voltage developed across input reference resistance is fed to the non-inverting input of operational amplifier 404. The output of operational amplifier 404 is coupled to the gates of transistors 406–412.

The highly parallel nature of current source 400 provides increased accuracy and matching of individual components. However, the use of so many components in parallel with one another increases the complexity of the current mirror and consumes a significant area on the integrated circuit in which the current mirror is used. A further disadvantage of this circuit is that the each of the resistors requires additional contacts, such as contacts 420 and 422, for providing an electrical connection with the other components of the circuit. These contacts consume additional area and introduce undesired variability in gain due to variability in the local contact resistance of each contact. Resistors R1–R21 have been implemented in the prior art by using separate mask-defined diffused, thin-film or implanted resistors. These series resistors served to degenerate or linearize transistors 406–412 so that the gain of current mirror 400 was more a function of the series resistances than the widths of the transistor devices.

With embedded source resistors such as those shown in FIGS. 1 and 3, the complexity and area of a current mirror can be significantly reduced while significantly increasing the precision of the current mirror. The embedded source resistors can be accurately fabricated within the device structure of the transistors without the need for extra local contacts. This significantly reduces variability caused by local contact resistance and can provide precision current gain.

FIG. 5 is a schematic diagram illustrating a current mirror according to one embodiment of the present invention. Current mirror 500 includes current input 502, current output 504, degenerated input transistor 506, degenerated output transistor 508, and embedded source resistors 510 and 512. Input transistor 506 is coupled to act as a diode, with its gate and drain coupled to current input 502 and its source coupled to voltage supply terminal GND. Output transistor 508 has a gate coupled to the gate of input transistor 506, a drain coupled to current output 504 and a source coupled to voltage supply terminal GND.

Current input 502 and current output 504 are coupled to a relatively positive voltage supply terminal VDD (not shown) either directly or through one or more intermediate components around which current mirror 500 is used. The voltage supply terminals VDD and GND are coupled to voltage supply rails that supply an operating voltage to the various elements within the integrated circuit on which current mirror 500 is fabricated, as is well-known in the art.

Embedded source resistors 510 and 512 are implemented by extending the lightly-doped regions to a desired length and width within the sources of transistors 506 and 508 and by blocking any added conductive layers (such as silicide) along the surfaces of the lightly-doped regions as discussed above with respect to FIG. 3. Since source resistors 510 and 512 can be matched very precisely, a highly accurate current mirror can be constructed without the need for numerous parallel components and additional local contacts for the source resistors.

The embedded source and/or drain resistors of the present invention can be implemented in a variety of different circuits and circuit configurations such as current steering circuits and precision gain blocks.

Although the present invention has been described with reference to preferred embodiments, workers skilled in the art will recognize that changes may be made in form and detail without departing from the spirit and scope of the invention. For example, the embedded resistors can be used in other circuit applications than the ones shown and discussed in the specification. The embedded resistors can be implemented in any active semiconductor device having a lightly-doped region positioned between the channel and the heavily-doped region of the device. Also, the term "coupled" used in the specification and in the claims can refer to a direct connection or a connection through one or more intermediate elements. In addition, the terms "source" and "drain" are interchangeable.

What is claimed is:

1. An integrated circuit fabricated according to a given technology, comprising:
   a substrate; and
   a current mirror formed by first and second degenerated transistors and having a current input and a current output, wherein:
   the first degenerated transistor is electrically coupled to form a diode and comprises:
      a first control terminal formed on the substrate:
      a first channel formed in the substrate beneath the first control terminal;
      first and second heavily-doped regions embedded in the substrate on opposing sides of the first channel;
      first and second output contacts positioned on the first and second heavily-doped regions, respectively, wherein the second output contact is electrically coupled to the first control terminal and the current input; and
      a first lightly-doped region extending between the first heavily-doped region and the first channel for a first length that is selected such that the first output contact is spaced from a respective edge of the first control terminal by a first distance that is at least twice as great as a minimum distance defined for the technology in which the integrated circuit is fabricated and the first lightly-doped region has a desired first resistance in series with the first output contact; and
   the second degenerated transistor comprises:
      a second control terminal formed on the substrate and electrically coupled to the first control terminal;
      a second channel formed in the substrate beneath the second control terminal;
      third and fourth heavily-doped regions embedded in the substrate on opposing sides of the second channel;
      third and fourth output contacts positioned on the third and fourth heavily-doped regions, respectively, wherein the fourth output contact is electrically coupled to the current output; and
      a second lightly-doped region extending between the third heavily-doped region and the second channel for a second length that is selected such that the third output contact is spaced from a respective edge of the second control terminal by a second distance that is greater than the minimum distance and the second lightly-doped region has a desired second resistance in series with the third output contact.

2. The integrated circuit of claim 1 and further comprising first and second voltage supply terminals for providing a supply voltage, and wherein:
   the first degenerated transistor is electrically coupled between the first and second voltage supply terminals; and
   the first lightly-doped region has a length, which is measured from the first channel to the first heavily-doped region and a width, which is measured along a width of the first control terminal, that are selected such that the first lightly-doped region produces a voltage drop from the respective first output contact to the first channel of at least one percent of the supply voltage.

3. The integrated circuit of claim 1 wherein the first heavily-doped region defines a source region, and the second heavily-doped region defines a drain region.

4. The integrated circuit of claim 1 wherein the first heavily-doped region defines a drain region, and the second heavily-doped region defines a source region.

5. The integrated circuit of claim 1 wherein the first degenerated transistor further comprises:
   a third lightly-doped region extending between the second heavily-doped region and the first channel for a third length that is selected such that the second output contact is spaced from a respective edge of the first control terminal by a third distance that is at least twice the minimum distance and the second lightly-doped region has a desired third resistance in series with the second output contact.

6. The integrated circuit of claim 1 wherein the first degenerated transistor further comprises:
   a third lightly-doped region extending between the second heavily-doped region and the first channel for a third length that is selected such that the second output contact is spaced from a respective edge of the first control terminal by the minimum distance.

7. The integrated circuit of claim 1 and further comprising a third, non-degenerated transistor comprising:
   a third control terminal formed on the substrate;
   a third channel formed in the substrate beneath the third control terminal;
   fifth and sixth heavily-doped regions embedded in the substrate on opposing sides of the third channel;
   fifth and sixth output contacts positioned on the fifth and sixth heavily-doped regions, respectively; and
   a third lightly-doped region extending between the fifth heavily-doped region and the third channel for a third length that is selected such that the fifth output contact is spaced from a respective edge of the third control terminal by the minimum distance defined for the technology in which the integrated circuit is fabricated.

8. The integrated circuit of claim 1 wherein the first and second desired resistances are scaled relative to one another to provide a desired current gain from the current input to the current output.

9. An integrated circuit comprising:
   first and second voltage supply terminals for providing a supply voltage;
   a substrate; and
   a current mirror formed by first and second degenerated transistors, wherein:
   the first degenerated transistor is coupled between the first and second voltage supply terminals and comprises:

a gate;

heavily-doped source and drain regions embedded in the substrate;

source and drain contacts positioned on the source and drain regions, respectively, wherein the drain contact is electrically coupled to the gate of the first degenerated transistor and defines a current input to the current mirror;

a channel defined beneath the gate and between the source and drain regions of the first degenerated transistor; and a first lightly-doped region positioned between the source region and the channel of the first degenerated transistor, wherein the first lightly-doped region has a length measured from the channel to the source region and a width measured along a width of the gate that are selected such that the first lightly-doped region produces a voltage drop from the source contact to the channel of at least one percent of the supply voltage; and the second degenerated transistor comprises:

a gate;

heavily-doped source and drain regions embedded in the substrate;

source and drain contacts positioned on the source and drain regions, respectively, of the second degenerated transistor;

a channel defined between the source and drain regions of the second degenerated transistor; and a second lightly-doped region positioned between the channel and the source region of the second degenerated transistor, wherein the second lightly-doped region has a length measured from the channel to the source region of the second degenerated transistor and a width measured along a width of the gate of the second degenerated transistor that are selected such that the second lightly-doped region produces a voltage drop from the respective source contact to the respective channel of at least one percent of the supply voltage.

10. The integrated circuit of claim 9 wherein the length and width of the first lightly-doped region are selected to introduce a desired resistance from the source contact to the channel of the first degenerated transistor.

11. The integrated circuit of claim 9 wherein the first degenerated transistor further comprises:

a third lightly-doped region positioned between the drain region and the channel of the first degenerated transistor, wherein the third lightly-doped region has a length measured from the channel to the drain region and a width measured along the width of the gate of the first degenerated transistor that are selected such that the third lightly-doped region produces a voltage drop from the respective drain contact to the channel of at least one percent of the supply voltage.

12. The integrated circuit of claim 9 wherein:

the first degenerated transistor further comprises a third lightly-doped region positioned between the drain region and the channel of the first degenerated transistor;

the drain contact of the first degenerated transistor is spaced from a corresponding nearest first edge of the gate of the first degenerated transistor by a minimum distance specified for a technology in which the integrated circuit is.fabricated; and the source contact of the first degenerated transistor is spaced from a corresponding nearest second edge of the gate of the first degenerated transistor by a distance that is greater than the minimum distance.

13. The integrated circuit of claim 9 and further comprising a non-degenerated transistor coupled between the first and second voltage supply terminals and comprising:

a gate;

heavily-doped source and drain regions embedded in the substrate;

source and drain contacts positioned on the source and drain regions, respectively, of the non-degenerated transistor;

a channel defined between the source and drain regions of the non-degenerated transistor; and third and fourth lightly-doped regions positioned between the source region and the channel and between the drain region and the channel, respectively, of the non-degenerated transistor and having lengths such that the source and drain contacts of the non-degenerated transistor are spaced from corresponding nearest edges of the gate of the non-degenerated transistor by a minimum distance specified for a technology in which the integrated circuit is fabricated.

14. The integrated circuit of claim 13 wherein the first lightly-doped region has a length measured from the respective source or drain region of the first degenerated transistor such that the source and drain contacts of the first degenerated transistor are spaced from corresponding nearest edges of the gate of the first degenerated transistor by a distance that is significantly greater than the minimum distance.

15. A current mirror fabricated on an integrated circuit, comprising:

a current input;

a current output;

a first transistor comprising a first gate, a first heavily-doped source region, a first source contact, a first heavily-doped drain region, a first drain contact electrically coupled to the first gate, a first channel, and a first lightly-doped source region which extends between the first channel and the first heavily-doped source region for a first length that is selected such that the first source contact is spaced from a respective edge of the first gate by a first distance that is greater than a minimum distance defined for the technology in which the integrated circuit is fabricated and the first lightly-doped source region has a desired first resistance in series with the first source contact; and a second transistor comprising a second gate electrically coupled to the first gate, a second heavily-doped source region, a second source contact, a second heavily-doped drain region, a second drain contact that defines the current output, a second channel, and a second lightly-doped source region which extends between the second channel and the second heavily-doped source region for a second length that is selected such that the second source contact is spaced from a respective edge of the second gate by a second distance that is greater than the minimum distance and the second lightly-doped source region has a desired second resistance in series with the second source contact.

16. The current mirror of claim 15 wherein the first and second desired resistances are scaled relative to one another to provide a desired current gain from the current input to the current output.

* * * * *